United States Patent
Ludowise

(10) Patent No.: US 7,019,330 B2
(45) Date of Patent: Mar. 28, 2006

(54) RESONANT CAVITY LIGHT EMITTING DEVICE

(75) Inventor: Michael J. Ludowise, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/652,798

(22) Filed: Aug. 28, 2003

(65) Prior Publication Data
US 2005/0045893 A1    Mar. 3, 2005

(51) Int. Cl.
*H01L 27/15* (2006.01)
*H01L 31/12* (2006.01)
*H01L 33/00* (2006.01)

(52) U.S. Cl. .................................. 257/79; 257/82
(58) Field of Classification Search ................ 257/79, 257/80, 82

See application file for complete search history.

(56) References Cited

U.S. PATENT DOCUMENTS

| | | | |
|---|---|---|---|
| 5,226,053 A | 7/1993 | Cho et al. | 372/45 |
| 5,376,580 A | 12/1994 | Kish et al. | 437/127 |
| 6,229,160 B1 | 5/2001 | Krames et al. | 257/94 |
| 6,274,924 B1 | 8/2001 | Carey et al. | 257/676 |
| 6,333,522 B1 | 12/2001 | Inoue et al. | 257/99 |
| 6,455,879 B1 | 9/2002 | Ashley et al. | |
| 6,486,499 B1 | 11/2002 | Krames et al. | 257/81 |
| 6,492,661 B1 | 12/2002 | Chien et al. | |
| 6,549,556 B1 | 4/2003 | Hwang et al. | |
| 2001/0042866 A1* | 11/2001 | Coman et al. | 257/103 |
| 2002/0003822 A1 | 1/2002 | Wiplejewski | |
| 2003/0081642 A1 | 5/2003 | Hwang et al. | |
| 2003/0209714 A1* | 11/2003 | Taskar et al. | 257/79 |
| 2003/0209722 A1* | 11/2003 | Hatakoshi et al. | 257/98 |
| 2005/0031005 A1* | 2/2005 | Cheng et al. | 372/68 |

OTHER PUBLICATIONS

Danaë Delbeke et al., "High-Efficiency Semiconductor Resonant-Cavity Light-Emitting Diodes: A Review", IEEE Journal on Selected Topics in Quantum Electronics, vol. 8, No. 2, Mar./Apr., 2002, pp. 189-206.

E. Fred Schubert et al., "Temperature and Modulation Characteristics of Resonant-Cavity Light-Emitting Diodes", Journal of Lightwave Technology, vol. 14, No. 7, Jul. 1996, pp. 1721-1729.

E. F. Schubert et al., "Resonant Cavity Light-Emitting Diode", Appl. Phys. Lett. 60(8), Feb. 24, 1992, American Institute of Physics, pp. 921-923.

(Continued)

*Primary Examiner*—Phat X. Cao
(74) *Attorney, Agent, or Firm*—Patent Law Group LLP

(57) ABSTRACT

A light emitting device includes a resonant cavity formed by a reflective metal layer and a distributed Bragg reflector. Light is extracted from the resonant cavity through the distributed Bragg reflector. A light emitting region sandwiched between a layer of first conductivity type and a layer of second conductivity type is disposed in the resonant cavity. In some embodiments, first and second contacts are formed on the same side of the resonant cavity, forming a flip chip or epitaxy up device.

11 Claims, 7 Drawing Sheets

OTHER PUBLICATIONS

H. Benisty et al., "Impact of Planar Microcavity Effects on Light Extraction-Part II: Selected Exact Simulations and Role of Photon Recycling", IEEE Journal of Quantum Electronics, vol. 34, No. 9, Sep. 1998, pp. 1632-1643.

H. Benisty et al., "Impact of Planar Microcavity Effects on Light Extraction-Part I: Basic Concepts and Analytical Trends", IEEE Journal of Quantum Electronics, vol. 34, No. 9, Sep. 1998, pp. 1612-1631.

Ralph Wirth et al., "High-Efficiency Resonant-Cavity LEDs Emitting at 650 nm", IEEE Photonics Technology Letters, vol. 13, No. 5, May 2001, pp. 421-423.

J.W. Gray et al., "High-Efficiency, Low Voltage Resonant-Cavity Light-Emitting Diodes Operating Around 650nm", Electronics Letters, Sep. 28th, 2000, vol. 36, No. 20, pp. 1730-1731.

P. Modak et al., "5.2% Efficiency InAlGaP Microcavity LEDs at 640nm on Ge Substrates", Electronics Letters, Mar. 15th, 2001, vol. 37, No. 6, pp. 377-378.

S. Orsila et al., "Resonant Cavity Light-Emitting Diodes Grown by Solid Source MBE", Journal of Crystal Growth 227-228 (2001) pp. 346-351.

European Search Report, 3 pages.

* cited by examiner

RESONANT CAVITY LIGHT EMITTING DEVICE

BACKGROUND

1. Field of the Invention

The present invention relates to semiconductor light emitting devices and, in particular, to resonant cavity light emitting devices.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III–V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Such devices typically have a light emitting or active region sandwiched between a p-doped region and an n-doped region. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques.

Semiconductor light emitting devices may be included in a variety of applications including displays such as flat panel displays, indicator lights such as traffic lights, and optical communication applications. In many applications, such as displays, it is desirable to have light emitted in a preferred direction. However, light from such semiconductor devices is typically emitted isotropically from the active region.

One method to improve the light emission characteristics of a device by providing more directed, anisotropic emission is proposed in U.S. Pat. No. 5,226,053, which teaches forming an optical cavity of an LED within a resonant Fabry-Perot cavity. FIG. 9 illustrates a resonant cavity LED (RCLED) according to U.S. Pat. No. 5,226,053. RCLED 110 comprises a bottom electrode 111, a substrate 112, a quarter-wave stack of a plurality of pairs of semiconductor layers forming a bottom distributed Bragg reflector (DBR) mirror, 113, one layer of each pair having a refractive index different from the refractive index of the other layer of the pair; a bottom confining layer, 114; an active layer or region, 115; a top confining layer, 116; a highly-doped contact layer, 117, and a top electrode, 118, having a centrally located aperture 119. The top mirror of the Fabry-Perot cavity is formed by an interface between contact layer 117 and air within aperture 119. Such a mirror has a reflectivity of the order of 0.25 to 0.35. The light emission takes place through the aperture. U.S. Pat. No. 5,226,053 teaches that the use of a Fabry-Perot resonant cavity formed by the DBR and the contact layer/air interface results in spontaneous light emission from the active region, which is restricted to the modes of the cavity.

SUMMARY

In accordance with embodiments of the invention, a light emitting device includes a resonant cavity formed by a reflective metal layer and a distributed Bragg reflector. Light is extracted from the resonant cavity through the distributed Bragg reflector. A light emitting region sandwiched between a layer of first conductivity type and a layer of second conductivity type is disposed in the resonant cavity. In some embodiments, first and second contacts are formed on the same side of the resonant cavity, forming a flip chip or epitaxy up device.

DETAILED DESCRIPTION

In accordance with the invention, a light emitting device such as an LED is formed with the active region located in a resonant cavity formed by two reflective surfaces, typically a reflective metal surface and a distributed Bragg reflector (DBR). The device may be a vertical device, where the p- and n-contacts are formed on opposite sides of the device, an epitaxy-up device, where the p- and n-contacts are formed on the same side of the device and light is extracted through the contact side, or a flip chip device, where the p- and n-contacts are formed on the same side of the device and light is extracted through the side of the device opposite the contact side. Many of the embodiments illustrated below are III-phosphide devices, however some embodiments of the invention may be fabricated in other materials systems, such as III-nitride. In addition, in the embodiments described below, the location of the p- and n-type regions of the device may be reversed.

Figure 1A:
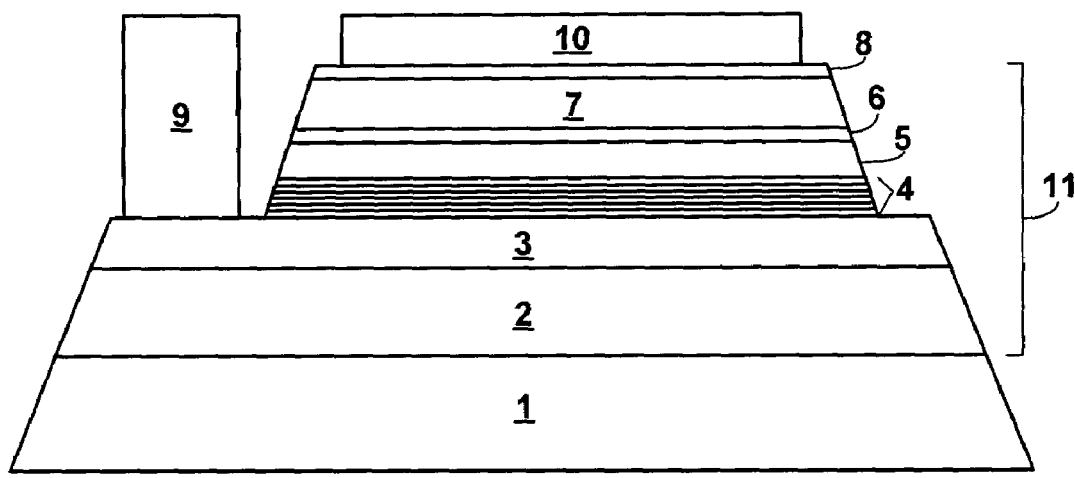
FIG. 1A is a cross sectional view of a flip chip RCLED according to an embodiment of the invention.

FIG. 1A is a cross sectional view of a flip chip RCLED. The device of FIG. 1A includes an active region 6 sandwiched between a p-doped cladding region 5 and an n-doped cladding region 7. The wavelength of light emitted by the active region may be controlled by selecting the width and composition of the layers in active region 6, as is known in the art. An example of a suitable active region includes 3 or 4 quantum wells separated by barrier layers. An n-contact layer 8 separates n-contact 10 from the n-doped cladding region 7. A p-contact 9 is formed on a p-doped contact layer 3. A distributed Bragg reflector 4 separates p-doped cladding region 5 and p-contact layer 3. Light is extracted from the device through a transparent window that includes an undoped GaP window layer 1 and a GaP layer 2. The table below gives examples of the thickness, composition, and dopant appropriate for each of layers 3, 5, 6, 7, and 8.

| | |
|---|---|
| P-doped contact layer 3 | Five micron thick layer of Mg doped GaP |
| P-doped cladding region 5 | One micron thick layer of Mg doped AlInP |
| Quantum wells of active region 6 | 125 angstrom thick layers of undoped InGaP |
| Barrier layers of active region 6 | 125 angstrom thick layers of undoped AlInP |
| N-doped cladding region 7 | One micron thick layer of Te doped AlInP |
| N-contact layer 8 | 500 angstrom thick layer of Te doped GaInP |

The characteristics given below for each layer are examples and are not meant to be limiting. More information on selecting the appropriate characteristics of the layers of the device may be found in chapters 1–3 of Semiconductors and Semimetals, Volume 64, Electroluminescence I, Academic Press, San Francisco, 2000, Gerd Mueller, ed., which is incorporated herein by reference.

Figure 1B:
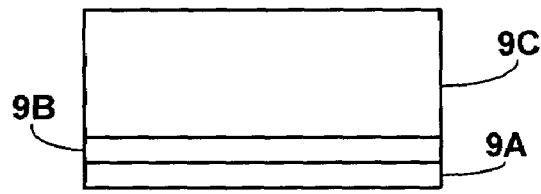
FIG. 1B illustrates a p-contact for the device illustrated in FIG. 1A.
Figure 1C:
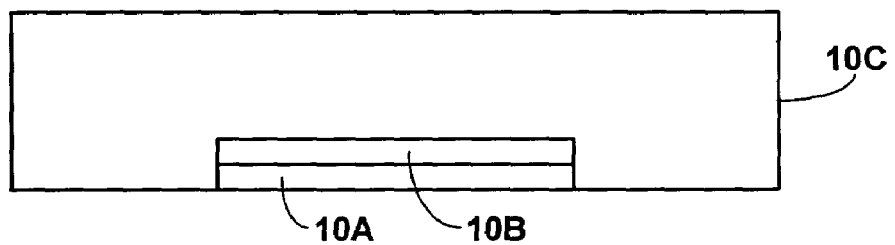
FIG. 1C illustrates an n-contact for the device illustrated in FIG. 1A.

P-contact 9 and n-contact 10 may be multilayer structures, as illustrated in FIGS. 1B and 1C. FIG. 1B illustrates an example of a multilayer p-contact. A layer of Au—Zn alloy 9A is formed adjacent to contact layer 3, in order to provide ohmic contact to the semiconductor layer. Au—Zn layer 9A is protected by a guard metal layer 9B of, for example, a sandwich of TiW, TiW:N, and TiW. A thick contact layer 9C, such as gold, is then formed over guard layer 9B. The ohmic layer 9A and guard layer 9B may cover all or just a portion of the semiconductor layer under reflector 9C.

A multilayer n-contact may have a similar structure, as illustrated in FIG. 1C. A layer of Au—Ge alloy 10A is formed adjacent to contact layer 8, in order to provide ohmic contact to the semiconductor layer. Au—Ge layer 10A is protected by a guard metal layer 10B of, for example, a sandwich of TiW, TiW:N, and TiW. A thick reflective layer 10C of Au is deposited over layers 10A and 10B. The ohmic layer 10A and guard layer 10B may cover all or just a portion of the semiconductor layer under reflector 10C.

The resonant cavity is formed by DBR 4 and the mirror created by reflective n-contact 10. The length of the cavity is typically an integer multiple of $\lambda/2$, where $\lambda$ is the wavelength of light emitted by the active region in the resonant cavity. Since the thickness of the active region may be fixed by the wavelength of light desired, the length of the resonant cavity may be adjusted by adjusting the thickness of cladding regions 5 and 7. The resonant cavity must be long enough to provide sufficient material to form a functioning device. Often, the cavity length is between about $10\lambda/2$ and about $50\lambda/2$. The physical center or center of brightness of the active region is placed near an antinode relative to the DBR.

In the embodiment of FIG. 1A, the mirror and the DBR are selected to be reflective to light generated by the active region and conductive. Since the DBR illustrated in FIG. 1A is epitaxially grown with the device layers, it must also be lattice matched to the layers on either side of the DBR. Light is extracted from the device through DBR 4. A suitable reflectivity for DBR 4 is between about 60% and about 90%, preferably about 75% to about 85%. In the III-phosphide device described above, DBR 4 may be comprised of, for example, alternating layers of Mg-doped AlInP and $(Al_xGa_{1-x})_{0.48}In_{0.52}P$ layers. The fraction of aluminum x in DBR 4 is typically more than the fraction of aluminum in a light emitting layer of the active region. For example, the fraction of aluminum in DBR 4 may be 5% greater than the fraction of aluminum in the active region. The composition of the layers included in DBR 4 is selected such that the DBR is transparent to light from the active region. The thickness and number of layers included in DBR 4 may be selected to create a desired reflectivity, as is known in the art. Suitably reflective n-contact materials for III-phosphide and III-nitride devices include Ag, Au, Al, Pt, Pd, Re, Ru, Rh, In, Cr, or alloys thereof. In some embodiments, the mirror material is selected to have a reflectivity of at least 75%. In other embodiments, the mirror is at least 80% reflective, and preferably at least 90% reflective. As illustrated in FIG. 1C, the entire surface of the mirror need not be the same material, and therefore may not have the same reflectivity. For example, a gold reflector may be formed over one or more sections of Au—Ge ohmic contacts.

Figure 2A:
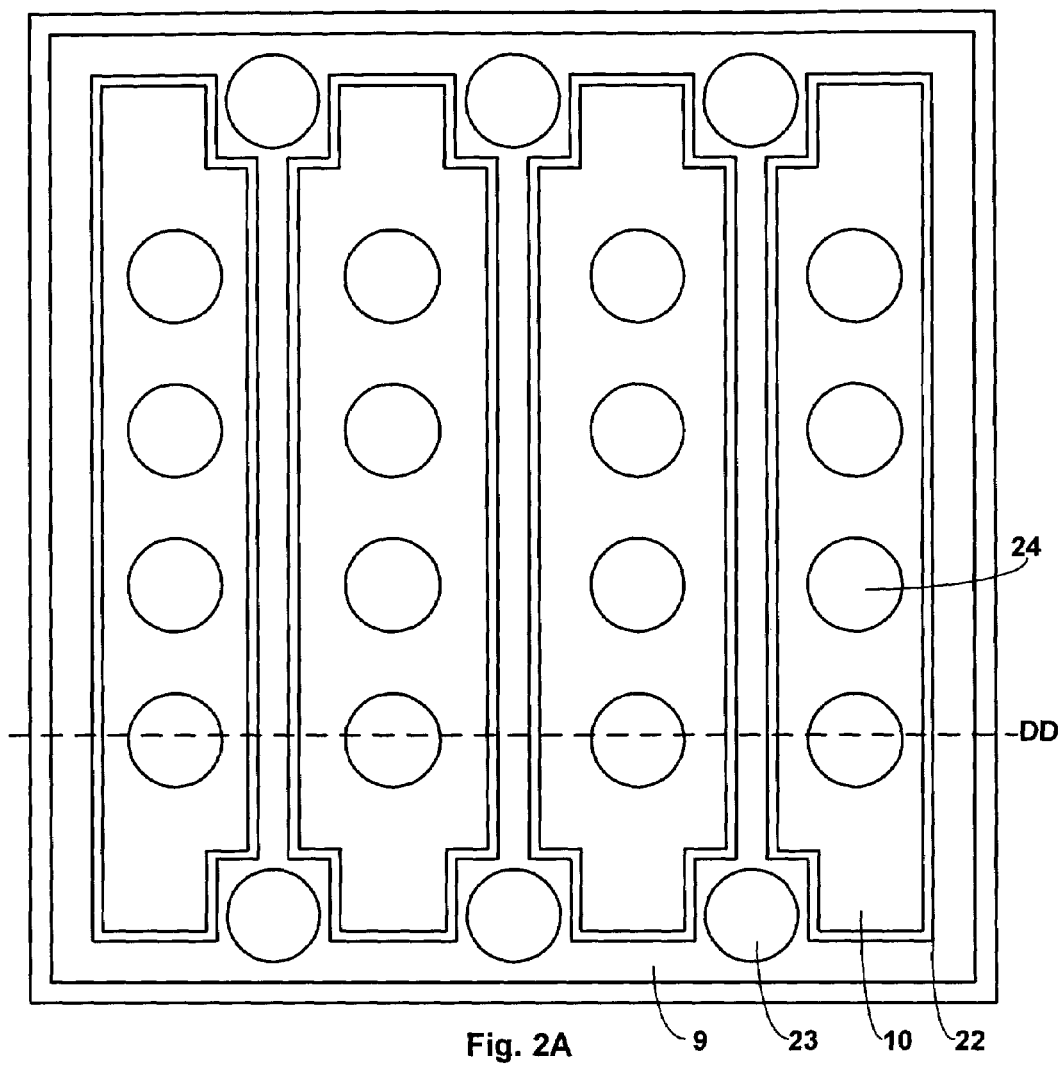
FIGS. 2A and 2B are a plan view and a cross sectional view of a contacting scheme for a large junction flip chip RCLED.
Figure 2B:
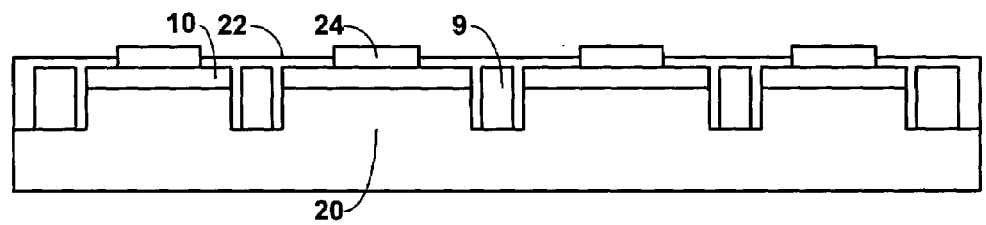

FIGS. 2A and 2B illustrate an arrangement of contacts 9 and 10 for a large junction device (that is, a device having an area greater than about $400 \times 400 \, \mu m^2$) according to FIG. 1A. FIG. 2A is a plan view and FIG. 2B is a cross section taken along line DD. Layers 20 are the same as layers 1, 2, 3, 4, 5, 6, 7, and 8 of FIG. 1A. The active region of FIG. 1A is divided into four isolated regions, in order to minimize the distance between the p- and n-contacts. P-contact 9 surrounds and interposes the four regions. N-contacts 9 are formed on the four regions. P- and n-contacts 9 and 10 are electrically isolated from each other by air or by optional insulating layer 22. Six p-submount connections 23 and sixteen n-submount connections 24 are deposited on the p- and n-contacts to form a surface suitable for connecting the device to a submount. The submount is often a silicon integrated circuit attached to the device by solder joints. In such embodiments, the p- and n-submount connections may be, for example, solderable metals. In other embodiments, the device is connected to the submount by gold bonds, cold welding, or thermocompression bonding.

Figure 3A:
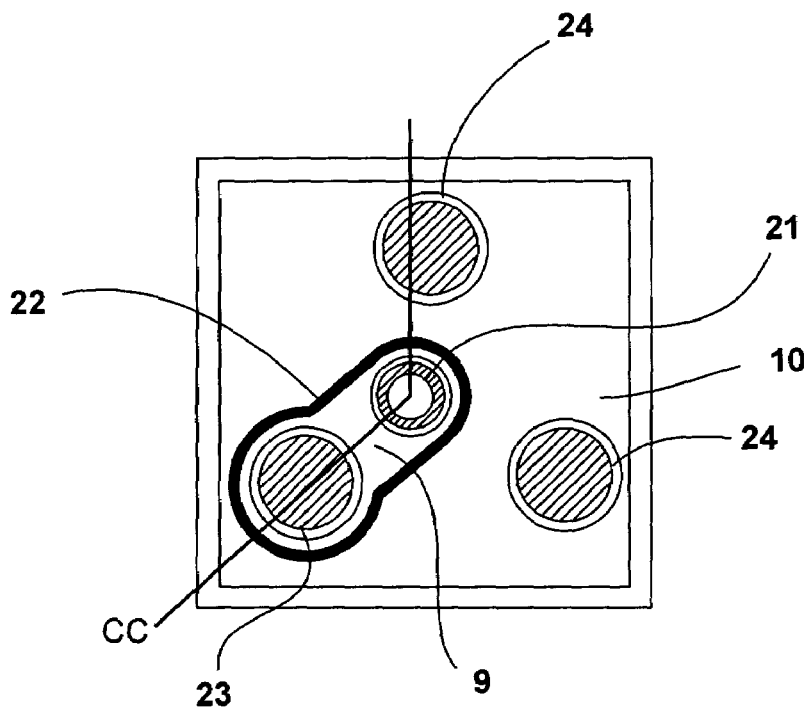
FIGS. 3A and 3B are a plan view and a cross sectional view of a contact scheme for a small junction flip chip RCLED.
Figure 3B:
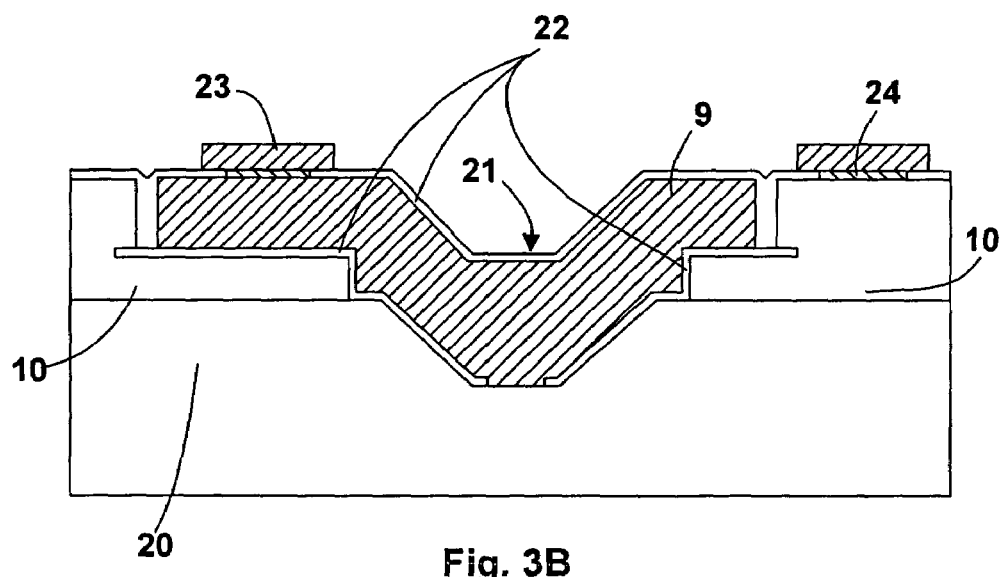

FIGS. 3A and 3B illustrate an arrangement of contacts 9 and 10 for a small junction device (that is, a device having an area less than about $400 \times 400 \, \mu m^2$) according to FIG. 1A. FIG. 3A is a plan view and FIG. 3B is a cross section taken along line CC. Layers 20 are the same as layers 1, 2, 3, 4, 5, 6, 7, and 8 of FIG. 1A. The device shown in FIGS. 3A and 3B has a single via 21 etched down to a p-type layer of epitaxial structure 20 below the active region. A p-contact 9 is deposited in via 21. P-via 21 is located at the center of the device to provide uniform current and light emission. An n-contact 10 provides electrical contact to the n-side of the active region of epitaxial structure 20. N-contact 10 is separated from the p-contact 9 by one or more dielectric layers 22. Two n-submount connections 24 connect to n-contact 10 and a p-submount connection 23 connects to p-contact 9. P-submount connection 23 may be located anywhere within p-contact region 9 (surrounded by insulating layer 22) and need not necessarily be located directly over via 21. Similarly, n-submount connections 24 may be located anywhere on n-contact 10. As a result, the connection of the device to a submount is not limited by the shape or placement of p-contact 9 and n-contact 10.

Figure 4:
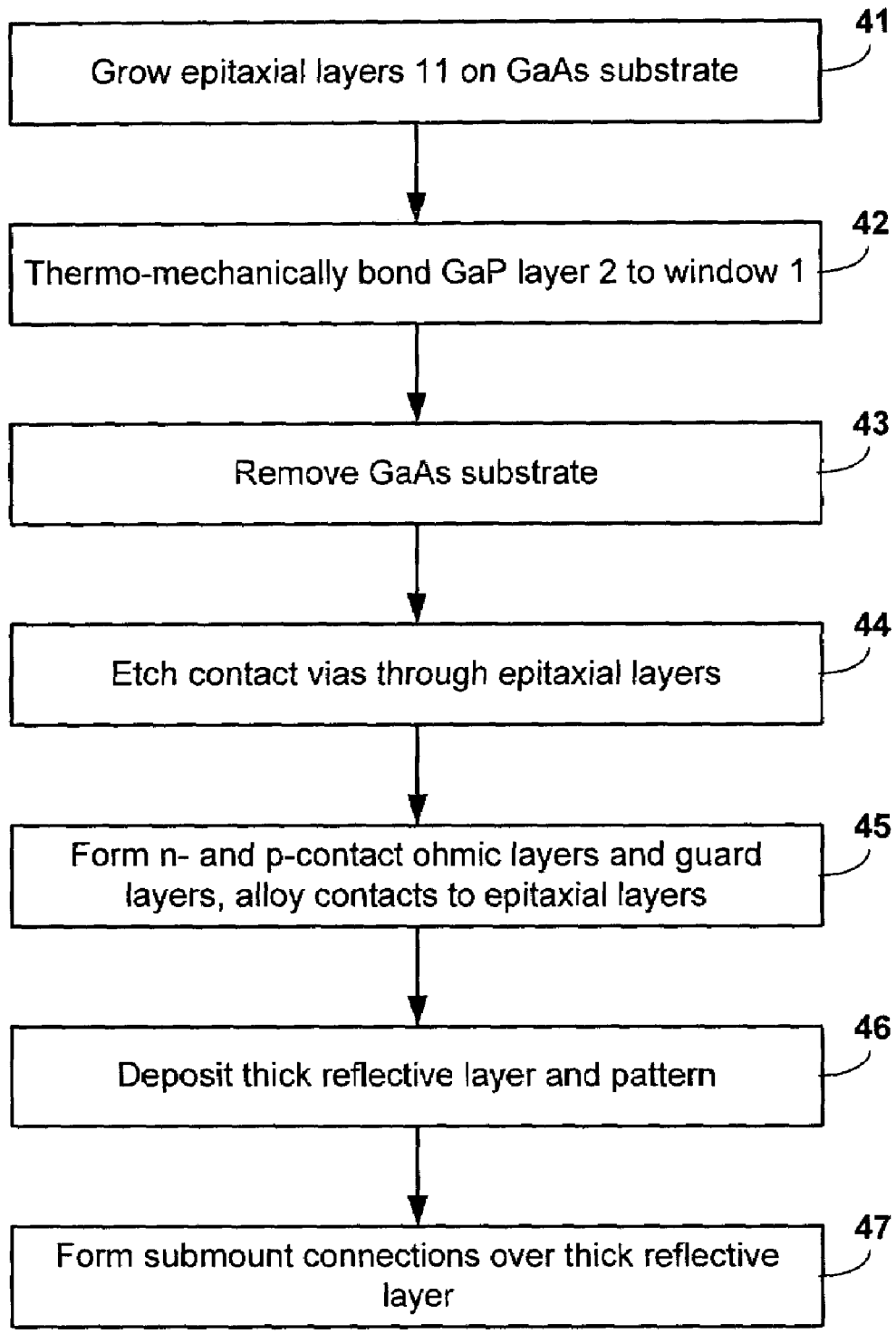
FIG. 4 illustrates a method of forming a III-phosphide RCLED according to FIG. 1A.

FIG. 4 illustrates a method for forming the device of FIG. 1A. First, in step 41, the epitaxial layers 11 of the device are grown by, for example, metal organic chemical vapor deposition on a GaAs substrate. Contact region 8 is grown first, then cladding region 7, active region 6, cladding region 5, DBR 4, and contact region 3. After contact region 3, a thick region of GaP 2 may be grown by, for example, vapor phase epitaxy. GaP layer 2 provides mechanical support and current spreading to the other layers of the device. The lattice constants of regions 8, 7, 6, 5, and 4 are controlled to be the same as the lattice constant of the GaAs growth substrate. Contact region 3 and VPE layer 2 are usually GaP, which is lattice-mismatched to GaAs. The composition of contact layer 3 and VPE layer 2 are selected to be transparent to light emitted by the active region. The structure may then be optionally chemo-mechanically polished to form a surface suitable for bonding.

Contact layer 3 is then thermo-mechanically bonded in step 42 to a host substrate including an undoped GaP window layer 1. An optional bonding layer may be disposed between VPE layer 2 and GaP window layer 1. A suitable bonding layer is $Ga_{0.9}In_{0.1}P$ grown on window layer 1 by, for example, MOVPE. GaP layers 1 and 2 have an index of refraction closely matched to the DBR and the active region, to avoid waveguiding and thus enhance light extraction from the device. Wafer bonding is described in more detail in U.S. Pat. No. 5,376,580, titled "Wafer Bonding Of Light Emitting Diode Layers" and incorporated herein by reference. The GaAs growth substrate is removed in step 43, exposing contact layer 8. In step 44, contact vias are etched through the epitaxial layers in order to expose parts of contact layer 3 on which p-contacts 9 will be formed. The contact vias may be etched according to the contacting schemes illustrated in FIGS. 2A and 3A, for example.

N- and p-contacts are formed in steps 45 and 46. First, ohmic contact layers 9A and 10A, then guard layers 9B and 10B (FIGS. 1B and 1C) are formed on the appropriate semiconductor layers and alloyed to the semiconductor layers by, for example, a rapid thermal anneal or anneal in a furnace. A thick reflective layer is then deposited over the device and patterned to form reflectors 9C and 10C. In step 47, submount connections such as solderable metals may be formed on completed n- and p-contacts. The device may then be mounted on a submount and packaged. The chip is shaped with beveled sides, as illustrated in FIG. 1A, by dicing the chip with a beveled blade. Shaped devices are described in more detail in U.S. Pat. No. 6,229,160, titled "Light Extraction From A Semiconductor Light-Emitting Device Via Chip Shaping" and incorporated herein by reference.

Figure 5:
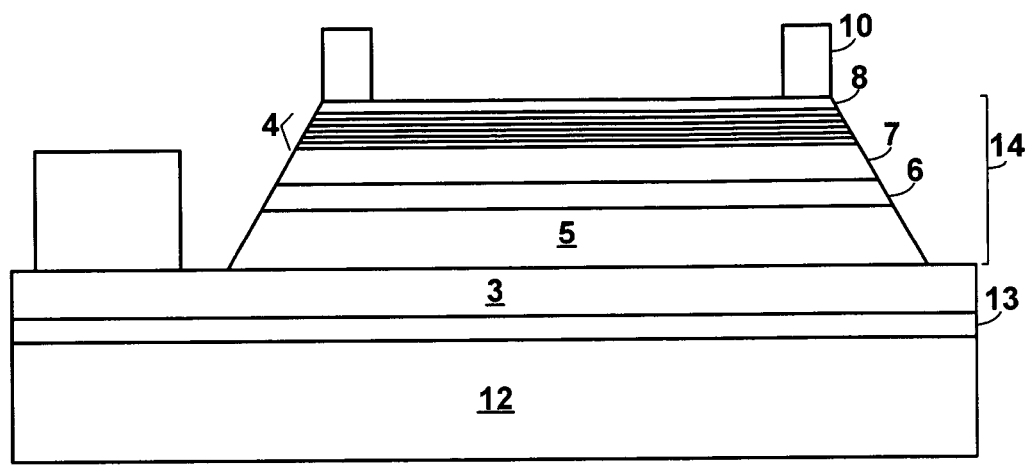
FIG. 5 is a cross sectional view an epitaxy-up RCLED according to an embodiment of the invention.
Figure 6:
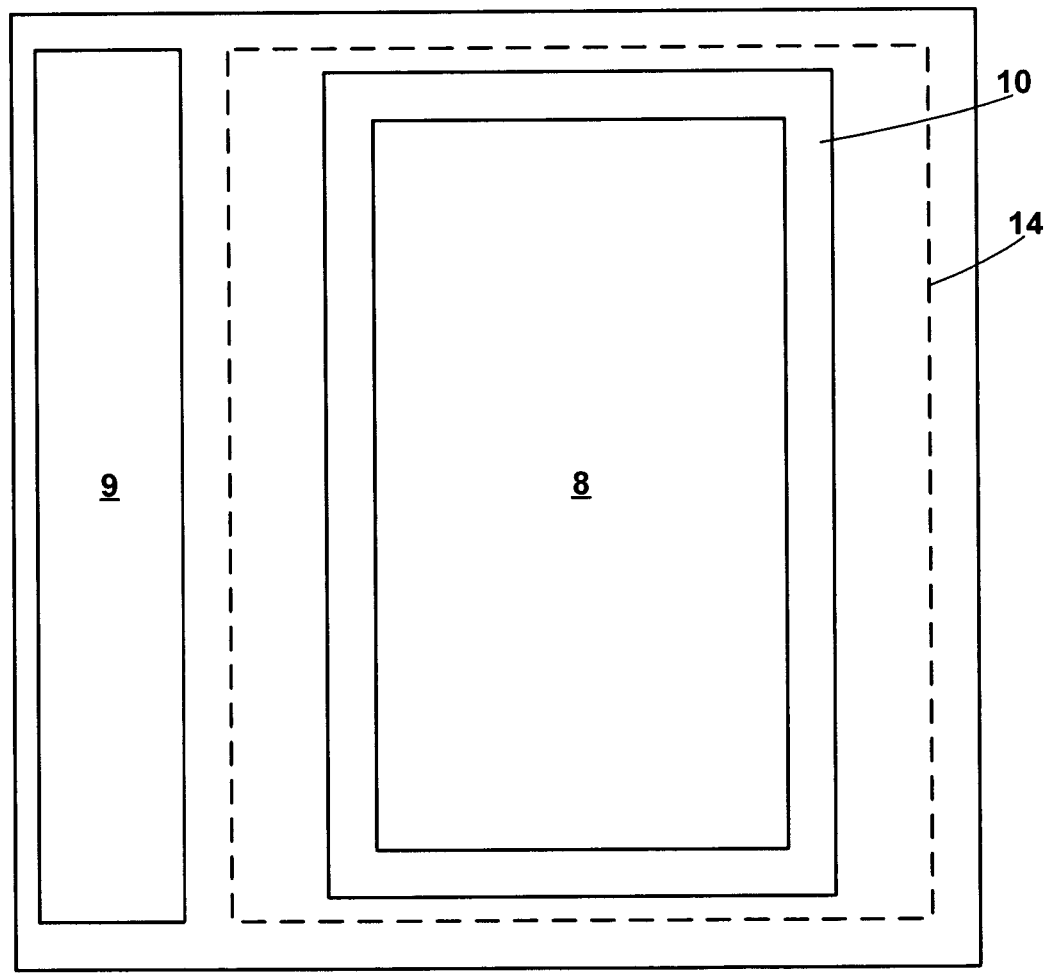
FIG. 6 is a plan view of the device of FIG. 5.

FIGS. 5 and 6 illustrate an epitaxy-up embodiment of the present invention. In the device of FIGS. 5 and 6, light is extracted from the device through the top of the device, i.e. side of the device on which contacts 9 and 10 are formed. Contact layer 8, DBR 4, cladding region 7, active region 6, cladding region 5, and contact layer 3 may have the same characteristics as described above in reference to FIG. 1A. Layers 14 may be shaped as illustrated in FIG. 5. Host substrate 12 is bonded to contact layer 3 by a reflective metal layer 13, which may be, for example, gold, silver, or aluminum. Since light is extracted from the top of the device, the host substrate bonded to the bottom of the device layers need not be transparent. Accordingly, in the device of FIG. 5 host substrate 12 may be, for example, Si, metal, or glass.

The resonant cavity is formed by DBR 4, located between n-type cladding region 7 and n-contact layer 8, and reflective metal layer 13, located between host substrate 12 and contact layer 3. The structure and reflectivity of DBR 4 and reflective metal layer 13 may be the same as DBR 4 and contact 10 of FIG. 1A. As in FIG. 1A, DBR 4 is the surface through which light is extracted from the resonant cavity. The length of the resonant cavity and the placement of active region 6 may be the same as described above in reference to FIG. 1A.

FIG. 6 is a plan view of the device of FIG. 5. Since light is extracted from the resonant cavity through DBR 4 and from the device through the surface of contact layer 8, n-contact 10 is constructed to cover as little of the surface of contact layer 8 as is required to form an electrical contact to layer 8. Usually, contact 10 is depositing such that 90% of the contact layer 8 is open, and contact 10 contacts 10% of contact layer 8. In the embodiment illustrated in FIG. 6, n-contact 10 forms a ring around contact layer 8. In other embodiments, n-contact 10 may be a mesh. P-contact 9 is formed on contact layer 3 adjacent to layers 14. The p- and n-contacts may be connected to bonding pads on a submount by traces, or the through conductive regions in host substrate 12, as illustrated in FIG. 7.

In some embodiments, the device illustrated in FIGS. 5 and 6 is formed as described above in FIG. 4, except that DBR 4 is grown between contact layer 8 and cladding region 7, and host substrate 12 and reflective layer 13 replace transparent layers 1 and 2. The structure of FIG. 5 offers an advantage over the structure of FIG. 1A in that DBR 4 is grown before the p-type layers of the device in the structure of FIG. 5. P-type material is known to grow with a rougher surface morphology than other material, which may disrupt the mirror planarity and function of a DBR grown over the p-type material. In some embodiments, DBR 4 and contact layer 8 are grown on a separate GaAs substrate, then wafer bonded to cladding region 7. The GaAs substrate is then removed.

Figure 7:
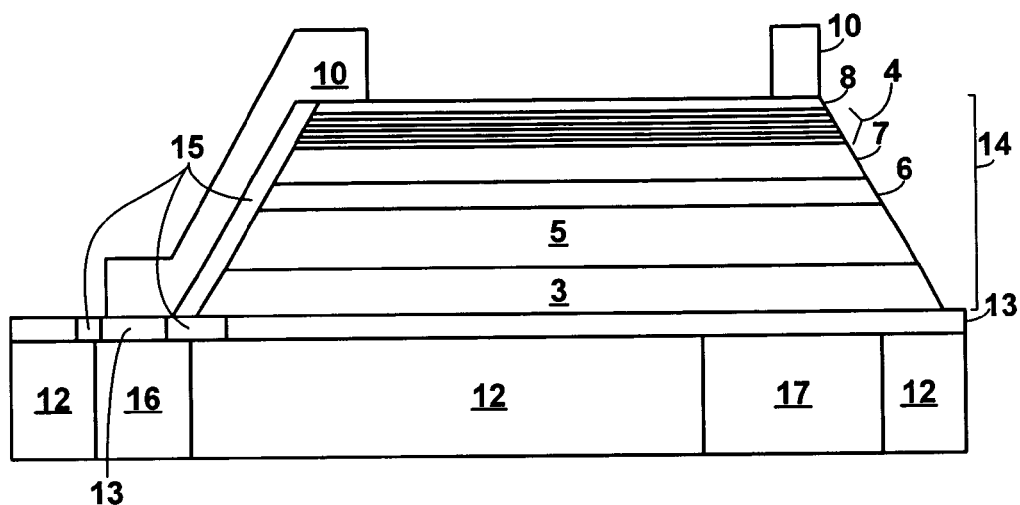
FIG. 7 is a cross sectional view of a vertical RCLED on a surface mountable substrate, according to an embodiment of the invention.
Figure 8:
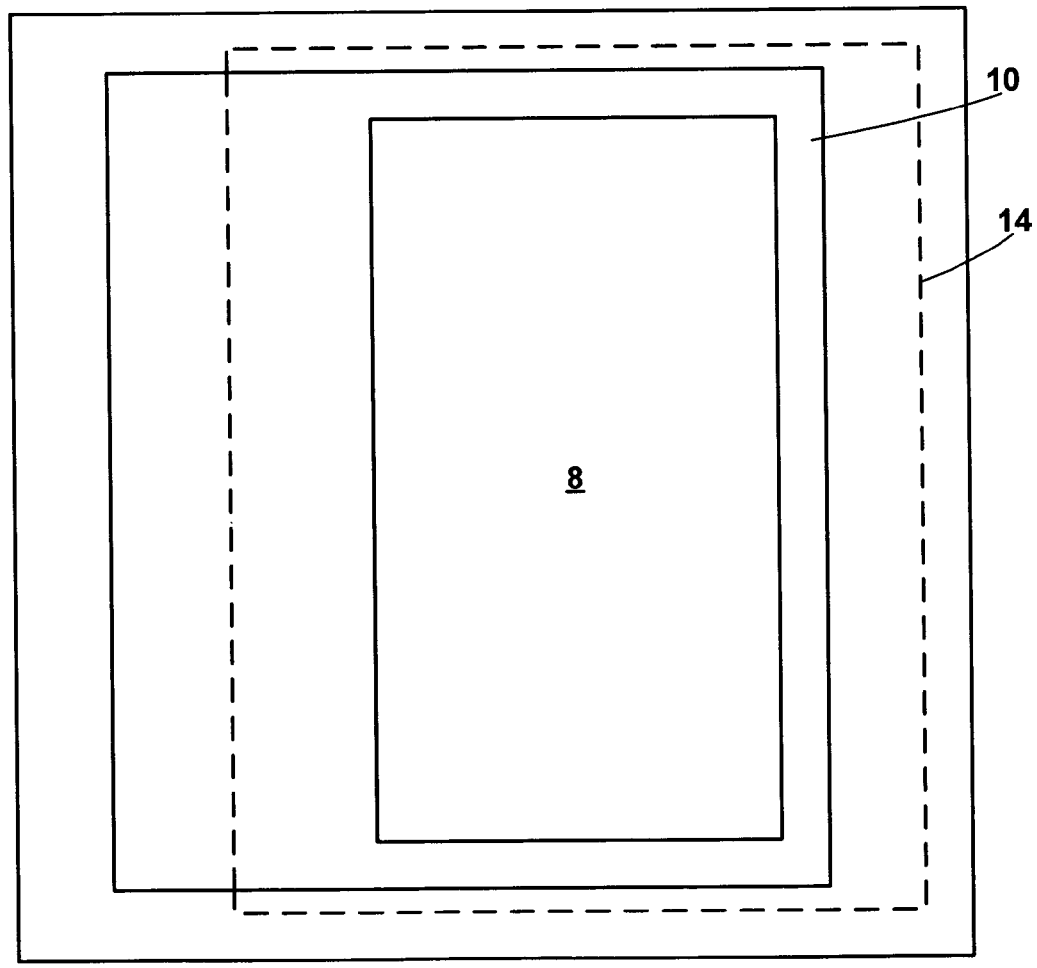
FIG. 8 is a plan view of the device of FIG. 7.
Figure 9:
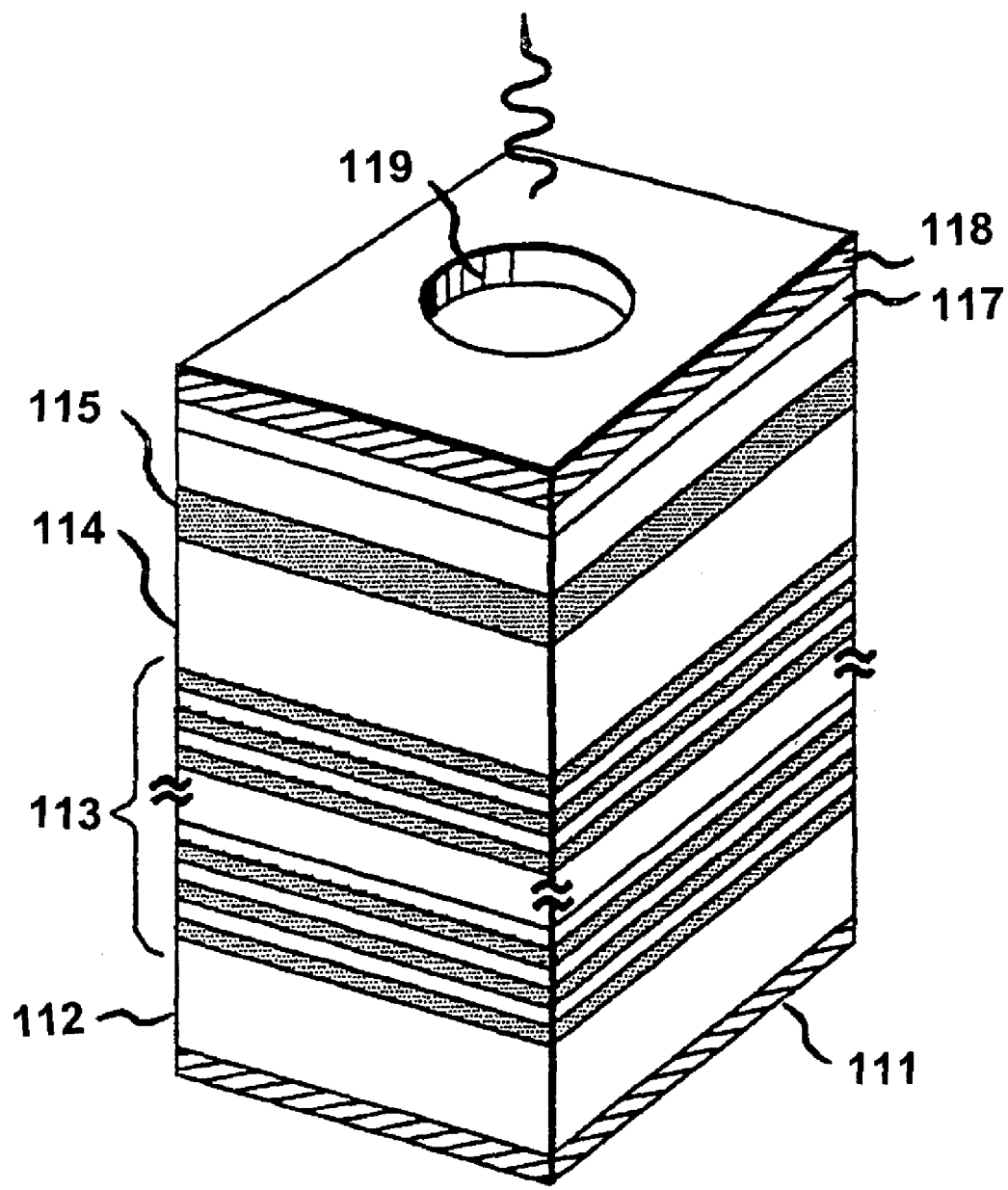
FIG. 9 illustrates a prior art RCLED.

FIGS. 7 and 8 illustrate a vertical embodiment of the present invention. Like the device of FIG. 5, light is extracted from the device from the surface of contact layer 8. The resonant cavity is formed by DBR 4 and reflective metal layer 13. N-contact 10, which forms a ring around contact layer 8, electrically contacts the n-side of the device. A portion of reflective metal layer 13 electrically contacts the p-side of the device. The host substrate bonded to contact layer 3 includes conductive regions 16 and 17 and insulating layer 12, which electrically connect to n-contact 10 and reflective p-contact 13. Host substrate 12 may be, for example, a silicon substrate, and conductive regions 16 and 17 may be metals or heavily doped semiconductor regions. Contact 10 connects to conductive region 16 by a layer of contact material extending down one or more sides of epitaxial layers 14. Layers 14 are electrically isolated from the contact material by an insulating layer 15. The portions of reflective metal layer 13 electrically connected to p-contact conductive region 17 and n-contact conductive region 16 are also isolated by an insulating layer 15. The device illustrated in FIGS. 7 and 8 may be surface mounted on another device by, for example, solder joints electrically and physically connected to tbe back side of conductive regions 16 and 17. Examples of host substrates surface mountable in this manner are described in more detail in U.S. Pat. No. 6,876,008, granted Apr. 5, 2005 titled "Mount for Semiconductor Light Emitting Device," and incorporated herein by this reference.

The inclusion of a resonant cavity in a light emitting device offers the advantage of concentrating light generated by the active region in a direction normal to the surface of the device. When included in applications requiring light to be emitted in a particular direction, such as displays, resonant cavity devices may be more efficient than devices without resonant cavities that emit light isotropically, since light emitted in directions other than the preferred direction is likely to be lost. In addition, since resonant cavity devices may be constructed to concentrate light in a direction normal to the surface of the device, structures typically used to capture light emitted in other directions, such as reflector cups, may not be needed with resonant cavity devices, beneficially reducing the source size of a resonant cavity device.

Though the embodiments described above are III-phosphide devices, some embodiments may be applied to III-nitride devices. For example, in the device of FIG. 1A, in a III-nitride device, DBR 4 may be formed on the opposite side of contact layer 3 and may be, for example, dielectric layers deposited after growth of the device. In the device of FIG. 5, DBR 4 may also be dielectric layers deposited after growth of the device. Since contact 10 cannot be deposited on dielectric layers, portions of DBR 4 may be removed to expose mesas of layer 7 on which contact 10 may be formed.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A light emitting device comprising:
    a structure comprising:
        a light emitting region disposed between a region of first conductivity type and a region of second conductivity type; and
        a distributed Bragg reflector;
    a substrate;
    a first contact electrically connected to the region of first conductivity type; and
    a second contact electrically connected to the region of second conductivity type, the second contact comprising a first metal layer having a reflectivity to light emitted by the light emitting region greater than 75%, the first metal layer being disposed between the substrate and the structure;
    wherein the first contact is electrically connected to the substrate by a second metal layer extending along a side surface of the structure.

2. The device of claim 1 wherein the light emitting region is disposed between the distributed Bragg reflector and the first metal layer.

3. The device of claim 1 wherein the first metal layer comprises a metal selected from the group of Ag, Au, Al, Pt, Pd, Re, Ru, Rh, Tn, Cr, and alloys thereof.

4. The device of claim 1 wherein the distributed Bragg reflector has a reflectivity to light emitted by the light emitting region between about 60% and about 90%.

5. The device of claim 1 wherein the distributed Bragg reflector and the first metal layer form a resonant cavity, and light generated by the light emitting region is extracted from the resonant cavity through the distributed Bragg reflector.

6. The device of claim 1 wherein the distributed Bragg reflector and the first metal layer form a resonant cavity, and a distance between the first metal layer and the distributed Bragg reflector is an integer multiple of $\lambda/2$, where $\lambda$ is the wavelength of light emitted by the light emitting region in the resonant cavity.

7. The device of claim 1 wherein the distributed Bragg reflector is disposed between the first contact and the region of first conductivity type.

8. The device of claim 7 wherein the first contact comprises a ring.

9. The device of claim 7 wherein the first contact comprises a mesh.

10. The device of claim 1 wherein the first metal layer has a reflectivity to light emitted by the light emitting region greater than 80%.

11. The device of claim 1 wherein the distributed Bragg reflector has a reflectivity to light emitted by the light emitting region between about 75% and about 85%.

* * * * *